(12) United States Patent
Hung et al.

(10) Patent No.: US 11,087,956 B2
(45) Date of Patent: Aug. 10, 2021

(54) DETECTION SYSTEMS IN SEMICONDUCTOR METROLOGY TOOLS

(71) Applicant: Taiwan Semiconductor Manufacturing Co., Ltd., Hsinchu (TW)

(72) Inventors: Shih-Wei Hung, Kaohsiung (TW); Jang Jung Lee, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 16/453,767

(22) Filed: Jun. 26, 2019

(65) Prior Publication Data
US 2020/0006033 A1 Jan. 2, 2020

Related U.S. Application Data

(60) Provisional application No. 62/691,920, filed on Jun. 29, 2018.

(51) Int. Cl.
*H01J 37/244* (2006.01)
*H01J 37/147* (2006.01)
(Continued)

(52) U.S. Cl.
CPC ............ *H01J 37/244* (2013.01); *G01Q 60/40* (2013.01); *H01J 37/147* (2013.01);
(Continued)

(58) Field of Classification Search
None
See application file for complete search history.

(56) References Cited

U.S. PATENT DOCUMENTS

| 5,360,976 A | 11/1994 | Young et al. |
| 6,806,467 B1 | 10/2004 | Funsten et al. |
| (Continued) | | |

FOREIGN PATENT DOCUMENTS

| TW | I474359 B | 2/2015 |
| TW | 1538009 B | 6/2016 |
| WO | WO 2016171675 A1 * | 10/2016 |

OTHER PUBLICATIONS

Mckenzie, W.R., et al., Focused Ion Beam Sample Preparation for Atom Probe Tomography, *Microscopy: Science, Technology, Applications and Education*, 2010, pp. 1800-1810.
(Continued)

*Primary Examiner* — Andrew Smyth
(74) *Attorney, Agent, or Firm* — Sterne, Kessler, Goldstein & Fox P.L.L.C.

(57) ABSTRACT

A semiconductor metrology tool for analyzing a sample is disclosed. The semiconductor metrology tool includes a particle generation system, a local electrode, a particle capture device, a position detector, and a processor. The particle generation system is configured to remove a particle from a sample. The local electrode is configured to produce an attractive electric field and to direct the removed particle towards an aperture of the local electrode. The particle capture device is configured to produce a repulsive electric field around a region between the sample and the local electrode and to repel the removed particle towards the aperture. The position detector is configured to determine two-dimensional position coordinates of the removed particle and a flight time of the removed particle. The processor is configured to identify the removed particle based on the flight time.

20 Claims, 4 Drawing Sheets

(51) Int. Cl.
*H01L 21/67* (2006.01)
*H01L 21/66* (2006.01)
*G01Q 60/40* (2010.01)

(52) U.S. Cl.
CPC ........ *H01L 21/67259* (2013.01); *H01L 22/14* (2013.01); *H01J 2237/0473* (2013.01)

(56) References Cited

U.S. PATENT DOCUMENTS

| | | | | |
|---|---|---|---|---|
| 7,569,841 | B2 | 8/2009 | Hill et al. | |
| 8,074,292 | B2* | 12/2011 | Bostel | H01J 49/0004 850/21 |
| 8,115,167 | B2 | 2/2012 | Raznikov et al. | |
| 2006/0108520 | A1* | 5/2006 | Park | H01J 49/107 250/287 |
| 2006/0113470 | A1* | 6/2006 | Gribb | H01J 37/10 250/310 |
| 2007/0181826 | A1* | 8/2007 | Bunton | G01N 23/22 250/491.1 |
| 2007/0205358 | A1* | 9/2007 | Bunton | H01J 49/067 250/282 |
| 2010/0223698 | A1* | 9/2010 | Bostel | H01J 49/0004 850/33 |
| 2010/0294928 | A1* | 11/2010 | Bunton | H01J 49/164 250/307 |
| 2011/0260054 | A1* | 10/2011 | Bunton | B82Y 15/00 250/307 |
| 2012/0168618 | A1* | 7/2012 | Vestal | H01J 49/004 250/282 |
| 2015/0048244 | A1* | 2/2015 | Akutsu | H01J 49/0027 250/282 |
| 2017/0140896 | A1* | 5/2017 | Liddicoat | H01J 49/40 |
| 2017/0372868 | A1* | 12/2017 | Kelly | H01J 37/16 |
| 2018/0130636 | A1* | 5/2018 | Bunton | H01J 37/285 |

OTHER PUBLICATIONS

Martens, Richard L., Specimen Preparation for Atom Probe Tomography, *1st Atom Probe Tomography (APT) Workshop for Earth Sciences*, 2016, pp. 1-48, The University of Alabama.

Kambham, Ajay Kumar, et al., Atom Probe Tomography for 3D-Dopant Analysis in FinFET Devices, *2012 IEEE Symposium on VLSI Technology Digest of Technical Papers*, pp. 77-78, ISBN 978-1-4673-0847-2; 2012.

Kambham, A.K., et al., Atom-probe for FinFET dopant characterization, *Ultramicroscopy*, 2011 111, pp. 535-539.

Gilbert, M., et al., Atom probe analysis of a 3D finFET with high-k metal gate, *Ultramicroscopy*, 2011 111, pp. 530-534.

Sijbrandij, S.J., et al., Improvements in the mass resolution of the three-dimensional atom probe, *Applied Surface Science* 1996 94/95, pp. 428-433.

* cited by examiner

DETECTION SYSTEMS IN SEMICONDUCTOR METROLOGY TOOLS

CROSS-REFERENCE TO RELATED APPLICATIONS

This application claims the benefit of U.S. Provisional Patent Application No. 62/691,920, titled "Novel Detector Design for Ultra-High Resolution Atom Probe Analysis," filed Jun. 29, 2018, the disclosure of which is incorporated by reference herein in its entirety.

BACKGROUND

With advances in semiconductor technology, there has been an increasing demand for higher storage capacity, faster processing systems, higher performance, and lower costs. To meet these demands, the semiconductor industry continues to scale down the dimensions of semiconductor devices and their manufacturing tolerances. Such scaling down has increased the demand for highly precise, sensitive, and accurate metrology tools for semiconductor device manufacturing process.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value).

In semiconductor device manufacturing, different metrology processes (e.g., critical dimension scanning electron microscopy, mass spectrometry, atomic force microscopy, transmission electron microscopy, or atom probe microscopy) are integrated at different points in the process flow to ensure that the desired quality of the manufactured semiconductor devices is achieved. For example, in a fin field effect transistor (finFET) manufacturing process, metrology processes can be performed after the formation of fin regions and/or doped epitaxial source/drain regions to analyze the quality and chemical composition of the fabricated fin and source/drain regions. One of the metrology tools used for such device quality and chemical composition analysis can be an atom probe microscope.

The atom probe microscope can analyze a sample of a device region of interest and provide a three-dimensional image with elemental mapping of the sample at an atomic scale (e.g., sub-nanometer scale). The analysis of the sample includes analyzing atoms of the sample individually by (i) removing atoms from the sample one at a time in the form of charged particles (e.g., ionized atoms), (ii) identifying the removed atoms, (iii) detecting two-dimensional position coordinates (e.g., X-Y coordinates) of the removed atoms, and (iv) tracking the detection sequence of the removed atoms in time. Based on the two-dimensional position coordinates and the detection sequence of the removed atoms, three-dimensional positions of the removed atoms can be determined and the three-dimensional image with elemental mapping of the analyzed sample can be generated.

The atom probe microscope can include a charged particle generation system to remove the atoms from the sample, a local electrode to collect the removed atoms, a charged particle position detector to detect the two-dimensional position coordinates of the removed atoms, and a processor to identify the removed atoms based on their mass values and/or mass-to-charge (m/z) ratios calculated from their time-of-flight (also referred to as flight time) measurements. The time-of-flight measurement of each removed atom can refer to a time interval measured between the atom's time of removal and time of detection at the position detector. The flight time of each removed atom can be correlated to its mass value by the following equation:

$$m=(2E/L^2)t^2 \qquad (1),$$

where m is the mass value of the removed atom, t is the flight time of the removed atom, L is the flight path length travelled by the removed atom between charged particle generation system and charged particle position detector, and E is the kinetic energy of the removed atom at the time of its removal from the sample. Thus, for a given kinetic energy (E) and flight path length (L), the mass (m) value or m/z ratio of the removed atom can be proportional to the square of its flight time (t).

One of the challenges of the atom probe microscope is preventing loss of the removed atoms during their flight from the charged particle generation system to the charged particle position detector. The loss of the removed atoms can negatively impact the detection efficiency of the atom probe microscope. Another challenge is accurately identifying the removed atoms with flight times close to each other. A small difference between the removed atoms' flight times (e.g., less than 1 ms, 1 µs, or 1 ns) makes it challenging to accurately resolve their close mass values calculated from the flight times for accurate elemental identification of the removed atoms. The poor mass resolution can negatively impact the three-dimensional elemental mapping accuracy of the atom probe microscope.

The present disclosure provides example charged particle detection systems for semiconductor metrology tools (e.g., atom probe microscopes) to improve their detection efficiency and mass resolution for analysis of a sample (e.g., a device region of interest). In some embodiments, a charged particle detection system can include a charged particle capture device configured to provide an electric field cage around a region between the sample and a local electrode of the charged particle detection system. The electrical field cage can be configured to prevent the charged particles, generated from the sample, from drifting away from their flight path towards the local electrode. As a result, the charged particle capture device can be configured to prevent and/or reduce the loss of charged particles during their flight towards the local electrode. In some embodiments, the loss of charged particles travelling towards the local electrode can also be prevented and/or reduced by widening the charged particle collection region of the local electrode. Such prevention and/or reduction of charged particle loss can improve the detection efficiency of the semiconductor metrology tool by about 60% to about 90% (e.g., about 60%, about 65%, about 70%, about 75%, about 80%, about 85%, or about 90%) compared to semiconductor metrology tools without the charged particle capture device and the widened local electrode.

In some embodiments, the charged particle detection system can further include a charged particle acceleration system configured to boost the kinetic energy of the charged particles exiting the local electrode and travelling towards a charged particle position detector. The boost in the kinetic energy can prevent and/or reduce the loss of charged particles if the charged particles do not have sufficient energy to reach the charged particle position detector. Such prevention and/or reduction of charged particle loss can improve the detection efficiency of the semiconductor metrology tool by about 50% to about 60% (e.g., about 50%, about 55%, or about 60%) compared to semiconductor metrology tools without the charged particle acceleration system.

In some embodiments, the charged particle detection system can further include a charged particle flight guide system configured to alter the flight direction of the charged particles exiting the charged particle acceleration system. The altered flight direction can be opposite and substantially parallel to the flight direction of the charged particles exiting the local electrode. By altering the flight direction, the charged particle flight guide system can increase the flight path length of the charged particles. With the increased flight path length, the difference between the flight times and calculated mass values of the charged particles can be increased, thus improving mass resolution to overcome the above discussed challenges of accurately identifying charged particles with close flight times. In some embodiments, the mass resolution can be improved by about 15% to about 30% (e.g., about 15%, about 20%, about 25%, or about 30%) compared to semiconductor metrology tools without the charged particle flight guide system.

Though the present disclosure is discussed with reference to an atom probe microscope, the embodiments of charge particle detection system can be applied to other mass spectrometry based semiconductor metrology tools without departing from the spirit and scope of the present disclosure.

Figure 1:
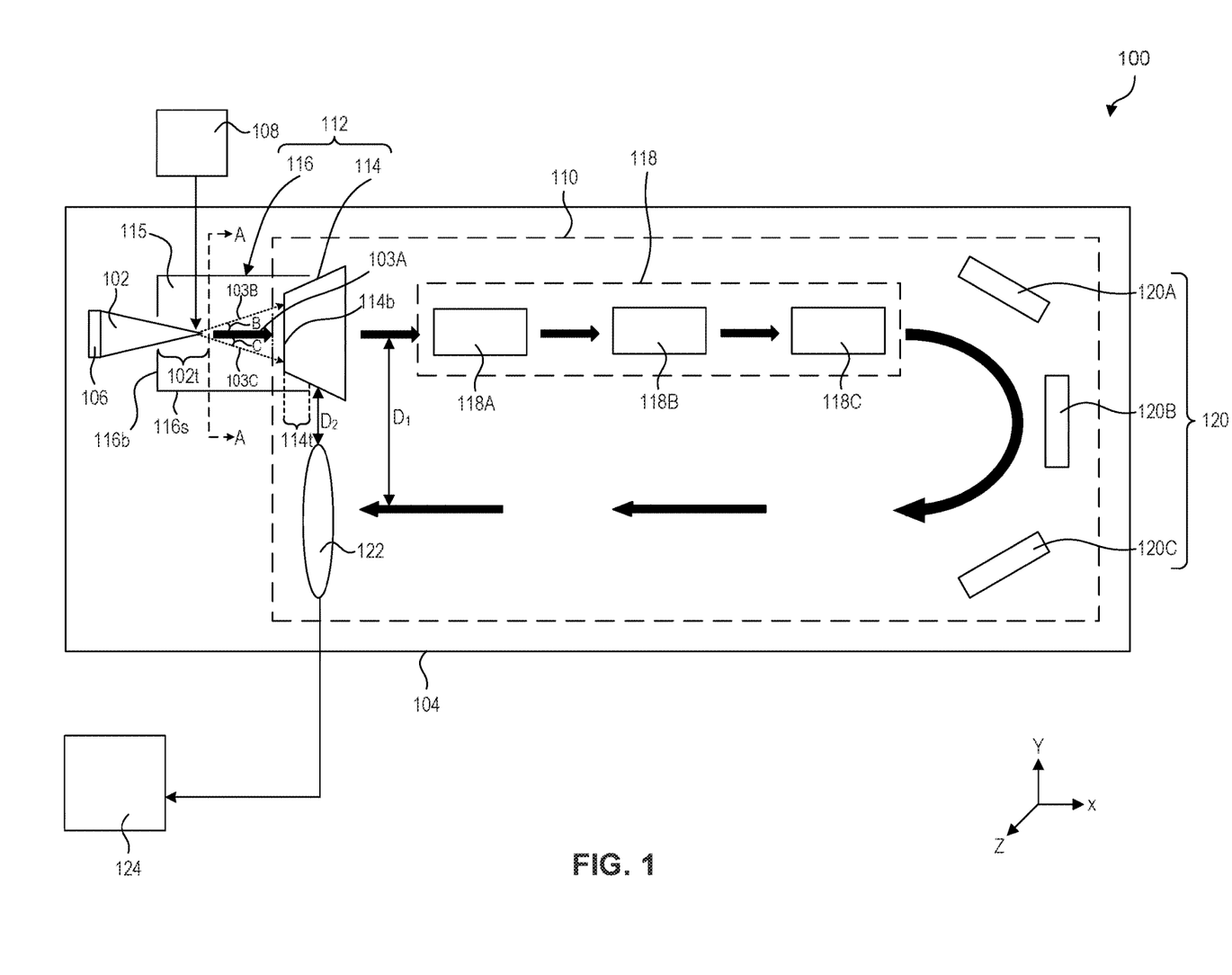
FIG. 1 illustrates a cross-sectional view of a metrology tool for a semiconductor device manufacturing process, in accordance with some embodiments.

FIG. 1 illustrates a top cross-sectional view of a semiconductor metrology tool 100 configured to analyze a sample 102 (e.g., a device region of interest) and output a three-dimensional image with elemental mapping of sample 102 at an atomic scale (e.g., sub-nanometer scale), according to some embodiments. In some embodiments, semiconductor metrology tool 100 can be an atom probe microscope. Semiconductor metrology tool 100 can include an analysis chamber 104, a sample mount 106, a charged particle generation system 108, a charged particle detection system 110, and a processing system 124.

Analysis chamber 104 can be structurally defined by chamber walls including a conductive material, such as copper (Cu), aluminum (Al), silver (Ag), gold (Au), nickel (Ni), tungsten (W), molybdenum (Mo), platinum (Pt), brass, or stainless steel. In some embodiments, analysis chamber 104 can be maintained at a ground potential. In some embodiments, analysis chamber 104 can include gas inlet and outlet ports (not shown) coupled to a vacuum system (not shown) configured to maintain an ultra-high vacuum ranging from about 10 torr to about 15 torr in analysis chamber 104 during the analysis of sample 102. The ultra-high vacuum within analysis chamber 104 can limit and/or prevent interactions of charged particles (e.g., ionized atoms), generated from sample 102, with any unwanted particles (e.g., contaminants) during their flight through charged particle detection system 110. Deviations in the flight path of the charged particles due to interactions with unwanted particles within analysis chamber 104 can prevent the charged particles from being detected, resulting in poor detection efficiency of semiconductor metrology tool 100.

Sample mount 106 can be configured to support sample 102 during its analysis within analysis chamber 104. In some embodiments, sample mount 106 can include a conductive material, such as Cu, Al, Ag, Au, Ni, W, Mo, Pt, brass, stainless steel, or a combination thereof. Sample 102 can be prepared to have a needle-shaped geometry prior to mounting on sample mount 106. The needle-shaped geometry can have a tip radius ranging from about 100 nm to about 150 nm and a dimension along an X-axis ranging from about 2 μm to about 10 μm. Sample mount 106 can position sample 102 such that the sharp tip of sample 102 faces charged particle detection system 110. For the sample 102 analysis process, sample 102 can be positively charged and biased at a high DC voltage ranging from about 1 kV to about 15 kV (e.g., about 1 kV, about 3 kV, about 5 kV, about 10 kV, or about 15 kV) by a voltage supply system (not shown) coupled to sample mount 106. Further, during the sample 102 analysis process, sample 102 can be maintained at a cryogenic temperature ranging from about 20 K to about 100 K (e.g., about 20 K, about 40 K, about 60 K, about 80 K, or about 100K) by a cooling system (not shown) coupled to sample mount 106.

Charged particle generation system 108 can be configured to intermittently apply positive high voltage electrical pulses (also referred to as high voltage pulses) and/or laser pulses to sample 102. The electrical or laser pulse repetition rate can be in the hundreds of kilo hertz (kHz) range and the high voltage can range from about 1 kV to about 20 kV (e.g., about 1 kV, about 5 kV, about 10 kV, or about 20 kV). The application of the high voltage pulses and/or laser pulses can remove atoms individually in the form of charged particles (e.g., an ionized atom) from sample 102 during the sample 102 analysis process. Each pulse of the high voltage and/or laser can be configured to induce the removal of an individual atom from sample 102. The timing of each pulse can be considered as the generation time of each corresponding charged particle formed as a result of an atom detaching from sample 102. The detachment of the atoms can be induced by the energy provided by the high electric field (e.g., ranging from about 10 V/nm to about 50 V/nm) created around the tip of sample 102 by the high voltage pulse and/or by the heat from the laser pulse. The energy can be larger than the ionization energy of the individual atoms.

Charged particle detection system 110 can be configured to collect, accelerate, identify, and spatially resolve the generated charged particles during the sample 102 analysis process. In some embodiments, charged particle detection system 110 can include a charged particle collection system 112, a charged particle acceleration system 118, a charged particle flight guide system 120, and a charged particle position detector 122.

Charged particle collection system 112 can include a local electrode 114 and a charged particle capture device 116. Local electrode 114 can be positioned between sample 102 and charged particle acceleration system 118 and can be configured to collect the generated charged particles. For the charged particle collection process, local electrode 114 can be biased at a ground potential or at a voltage lower than the DC bias voltage of sample 102 to create an attractive electrical field between sample 102 and local electrode 114. This electric field can attract and direct the generated charged particles to local electrode through an aperture (not shown) at base 114b of local electrode 114. The aperture diameter can be about 10 to about 200 times (e.g., about 10 times, about 50 times, about 100 times, or about 200 times) greater than a radius or width of base of sample 102 for efficient collection of the generated charged particles.

Such wide aperture compared to sample 102 can prevent and/or reduce the loss of charged particles generated from sample 102 with wide trajectory angles. Trajectory angles can be considered as wide when flight paths (e.g., flight paths 103B-103C in FIG. 1) of the generated charged particles make angles (e.g., angles B-C in FIG. 1) equal to or greater than about 10 degrees (e.g., about 15 degrees, about 20 degrees, about 25 degrees, about 30 degrees, about 45 degrees, about 60 degrees, or about 75 degrees) with respect to the charged particle flight path (e.g., flight path 103A) perpendicular to base 114b of local electrode 114. The prevention and/or reduction of charged particle loss can improve the detection efficiency of semiconductor metrology tool 100 by about 60% to about 90% (e.g., about 60%, about 65%, about 70%, about 75%, about 80%, about 85%, or about 90%) compared to semiconductor metrology tools without the widened aperture of local electrode 114.

The efficiency of charged particle collection can be further increased during the analysis process by maintaining a horizontal distance along an X-axis ranging from about 0.5 mm to about 5 mm (e.g., about 0.5 mm, about 1 mm, about 3 mm, or about 5 mm) between the tip of sample 102 and base 114b of local electrode 114. As the tip of sample 102 shifts continuously away from local electrode 114 during charged particle generation process, the position of local electrode 114 can be continuously adjusted to maintain the horizontal distance between sample 102 tip and base 114b. The horizontal distance outside the range of about 0.5 mm to about 5 mm can negatively impact the charged particle collection efficiency.

The presence of the attractive electric field between sample 102 and local electrode 114 can also improve charged particle generation efficiency. This electric field can provide energy for the removal of atoms from sample 102 in addition to the energy provided by charged particle generation system 108. As a result, the voltage magnitude of the high voltage pulses and/or energy of the laser pulses of charged particle generation system 108 can be reduced. Voltage pulses and/or laser pulses of lower magnitude can allow faster pulsing, and thus faster generation of charged particles, which can lead to faster data acquisition for the sample 102 analysis process.

Charged particle capture device 116 can also prevent and/or reduce the loss of charged particles generated from sample 102, thus improving generated particle collection and detection efficiency compared to semiconductor metrology tools without a charged particle capture device. In some embodiments, charged particle capture device 116 can be positioned between sample 102 and local electrode 114 such that it encloses a top portion 102t of sample 102, a bottom portion 114t of local electrode 114, and the region between sample 102 and local electrode 114 to form an enclosed region 115, as shown in FIG. 1. Top portion 102t can have a dimension along an X-axis ranging from about 100 nm to about 200 nm (e.g., about 100 nm, about 150 nm, or about 200 nm). Bottom portion 114t can have a dimension along an X-axis ranging from about 10 nm to about 1 mm (e.g., about 10 nm, about 100 nm, about 500 nm, about 700 nm, about 1 μm, about 500 μm, or about 1 mm). In some embodiments, charge particle capture device 116 can be mounted within analysis chamber 104 such that its sidewall 116s and base 116b are not in physical contact with sample 102. In some embodiments, top portion of sidewall 116s can be directly or indirectly coupled (not shown) to local electrode 114 or can be separated from local electrode 114 as shown in FIG. 1.

Charged particle capture device 116 can be positively biased with a voltage ranging from about 1 V to about 1 kV (e.g., about 1 V, about 50 V, about 100 kV, about 250 kV, about 500 kV, or about 1 kV) to create a repulsive electric field cage around enclosed region 115. The repulsive electric field cage can repel charged particles generated with trajectory angles (e.g., angles B-C in FIG. 1) equal to or greater than about 30 degrees (e.g., about 35 degrees, about 45 degrees, about 60 degrees, about 75 degrees, about 90 degrees, about 120 degrees, or about 145 degrees) toward flight path 103A-103C and aperture of local electrode 114. The repulsive electric field cage can also repel generated charged particles that drift away from their flight path 103A-103C. As a result, charged particle capture device 116 can prevent and/or reduce the loss of charged particles during their flight towards local electrode 114. The prevention and/or reduction of charged particle loss can improve the detection efficiency of semiconductor metrology tool 100 by about 60% to about 90% (e.g., about 60%, about 65%, about 70%, about 75%, about 80%, about 85%, or about 90%) compared to semiconductor metrology tools without charged particle capture 116.

Figure 2:
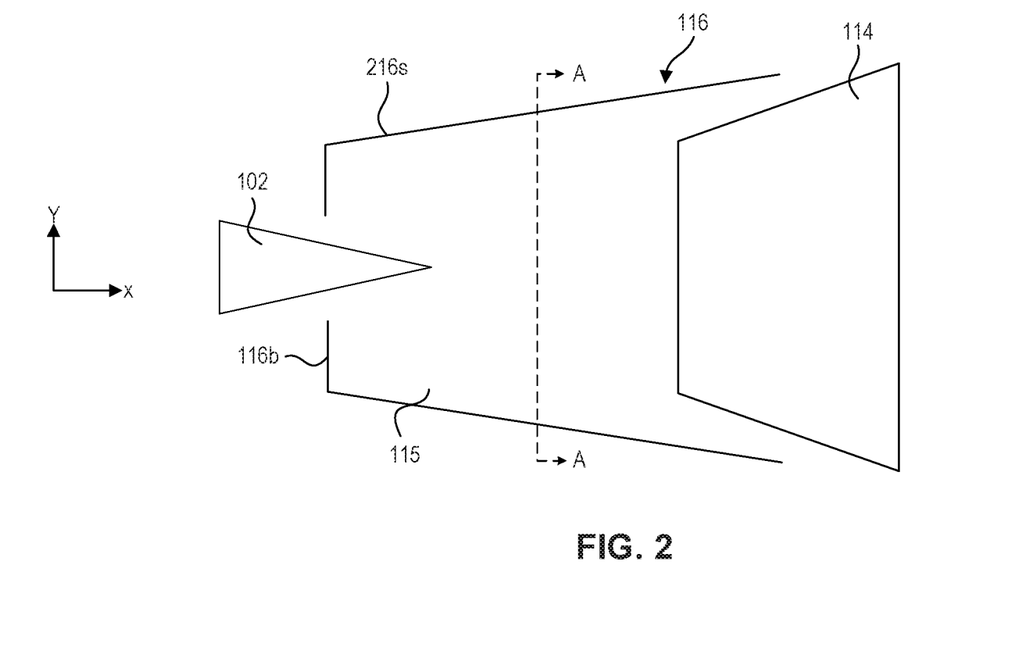
FIGS. 2-3 illustrate cross-sectional views of a charged particle collection system with different configurations of a charged particle capture device of a metrology tool, in accordance with some embodiments.
Figure 3:
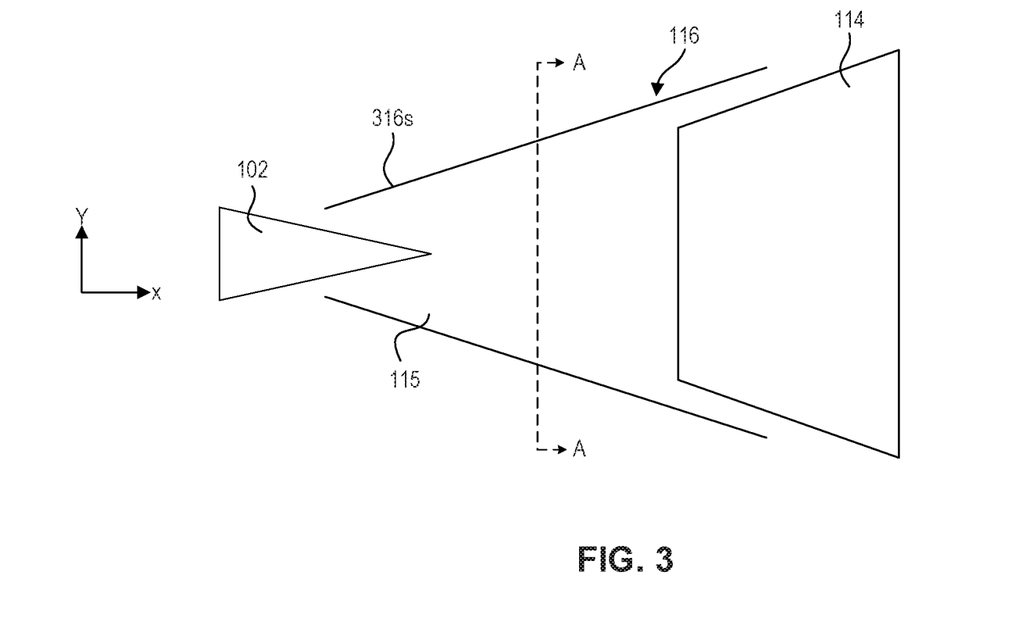

In some embodiments, charged particle capture device 116 can include a conductive material, such as Cu, Al, Ag, Au, Ni, W, Mo, Pt, brass, stainless steel, or a combination thereof. In some embodiments, sidewall 116s and/or base 116b of charged particle capture device 116 can have a solid material, a mesh-like material, or a combination thereof. In some embodiments, instead of straight sidewall 116s, charged particle capture device 116 can have sloped sidewall 216s as shown in FIG. 2. Such structural configuration of charged particle capture device 116 of FIG. 2 can create the repulsive electric field cage closer to sample 102 for faster repelling of charged particles toward local electrode 114 compared to charged particle capture device 116 of FIG. 1. The repulsive electric field cage can be created closer to sample 102 if charged particle capture device 116 has a funnel-shaped structure as shown in FIG. 3.

Figure 4:
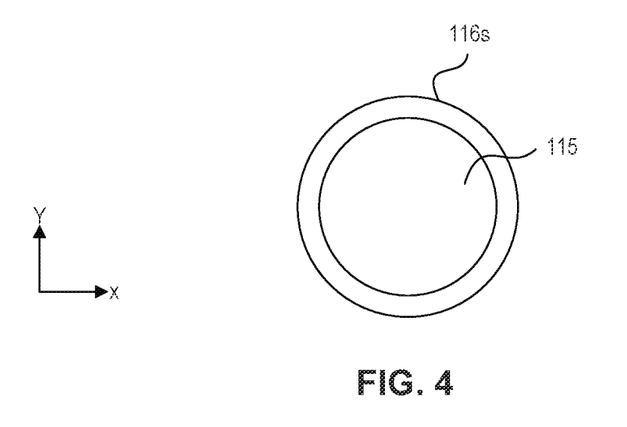
FIGS. 4-7 illustrate various cross-sectional views of a charged particle capture device of a metrology tool, in accordance with some embodiments.
Figure 5:
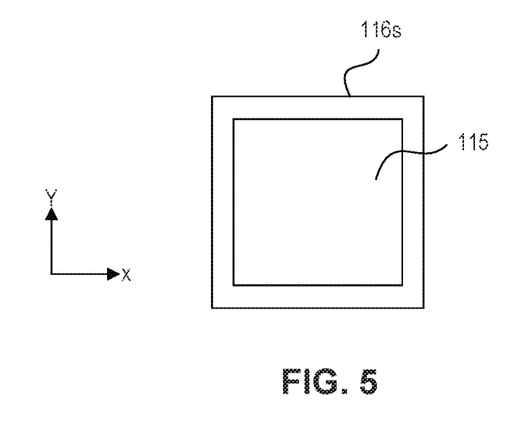

Referring to FIG. 1, in some embodiments, sidewall 116s of charged particle capture device 116 can be a continuous structure surrounding enclosed region 115. In such embodiments, along line A-A of FIG. 1, charged particle capture device 116 can have a closed circular or rectangular cross-section as shown in FIGS. 4-5, respectively. Though closed circular and rectangular cross-sections are shown in FIGS. 4-5, charged particle capture device 116 can have a cross-section of any geometric shape, such as triangular, elliptical, trapezoidal, or polygonal along line A-A of FIG. 1.

Figure 6:
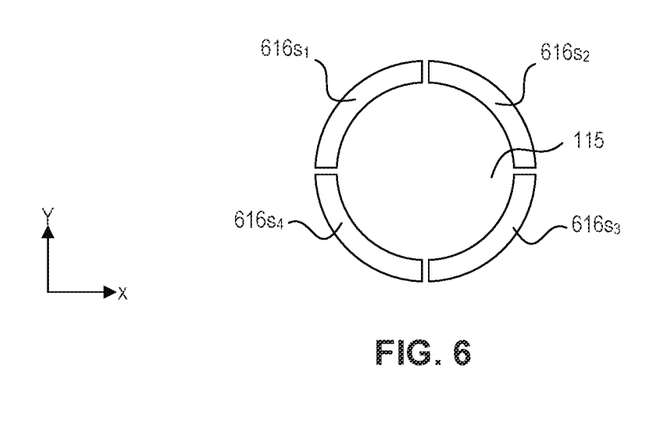
Figure 7:
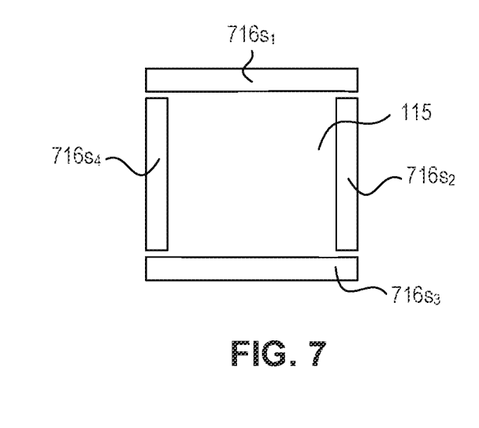

Referring to FIG. 1, in some embodiments, sidewall 116s of charged particle capture device 116 can include a plurality of sidewall segments (e.g., segments $616s_1$-$616s_4$ of FIG. 6 or segments $716s_1$-$716s_4$ of FIG. 7) surrounding enclosed region 115. Sidewall 116s with plurality of sidewall segments can help to adjust the volume of enclosed region 115 based on the dimensions of sample 102 and/or local electrode 114. In such embodiments, along line A-A of FIG. 1, charged particle capture device 116 can have a segmented circular or rectangular cross-section as shown in FIGS. 6-7, respectively. Sidewall 116s can have plurality of segments $616s_1$-$616s_4$ arranged in a circular manner around enclosed region 115 as shown in FIG. 6 or can have plurality of segments $716s_1$-$716s_4$ arranged in a rectangular manner around enclosed region 115 as shown in FIG. 7.

Each segment in plurality of segments $616s_1$-$616s_4$ or $716s_1$-$716s_4$ can be separated from its neighboring segments as shown in FIGS. 6-7, respectively, or can be in physical contact with its neighboring segments (not shown). Though four segments are shown in each of plurality of segments $616s_1$-$616s_4$ and $716s_1$-$716s_4$, sidewall 116s can have two or more segments. Though plurality of segments $616s_1$-$616s_4$ and $716s_1$-$716s_4$ are shown in FIGS. 6-7 to be arranged in respective circular and rectangular manner, they can be arranged in any manner of geometric shape, such as elliptical, triangular, trapezoidal, or polygonal. The above discussion of sidewall 116s with reference to FIGS. 4-7 applies to sidewalls 216s and 316s.

Referring to FIG. 1, charged particle detection system 110 can additionally or optionally have charged particle acceleration system 118 to prevent and/or reduce the loss of charged particles exiting local electrode 114 with low energy (e.g., less than about 500 eV, about 200 eV, about 100 eV, about 50 eV, about 30 eV, or about 10 eV). Such prevention and/or reduction of charged particle loss can improve the detection efficiency of the semiconductor metrology tool by about 50% to about 60% (e.g., about 50%, about 55%, or about 60%) compared to semiconductor metrology tools without the charged particle acceleration system.

Charged particle acceleration system 118 can be configured to receive the charged particles from local electrode 114 and to accelerate the received charged particles. In some embodiment, charged particle acceleration system 118 can include first, second, and third accelerators 118A-118C. First accelerator 118A can be configured to receive a charge particle from local electrode 114 at a first velocity and to accelerate the charged particle to a second velocity higher than the first velocity. Second accelerator 118B can be configured to receive the charged particle from first accelerator 118A at the second velocity and to accelerate the charged particle to a third velocity higher than the second velocity. Third accelerator 118C configured to receive the charge particle from second accelerator 118B at the third velocity and to accelerate the charged particle to a fourth velocity higher than the third velocity.

In some embodiments, first accelerator 118A can be a linear accelerator configured to supply a DC voltage ranging from about 1 kV to about 5000 kV to provide an initial low-energy to charged particles with a first energy received from local electrode before injecting them into second accelerator 118B with a second energy higher than the first energy. The linear accelerator can have an accelerating tube with an aspect ratio ranging from about 10 to about 1000 (e.g., about 10, about 100, about 500, or about 1000), where the aspect ratio can be a ratio of the tube length to the tube diameter.

In some embodiments, second accelerator 118B can be a cyclic accelerator (e.g., cyclotron) configured to supply an AC voltage with a frequency ranging from about 1 MHz to about 500 MHz (e.g., about 1 MHz, about 50 MHz, about 100 MHz, about 300 MHz, or about 500 MHz) to further increase the energy of the charged particles received from first accelerator 118A. The energy can be increased by passing the charged particles through a magnetic field of the cyclic accelerator before they are injected into third accelerator 118C with a third energy higher than the second energy. The cyclic accelerator can have an accelerating tube with a dimension along an X-axis ranging from about 90 mm to about 1 m (e.g., about 90 mm, about 50 cm, about 75 cm, or about 1 m).

In some embodiments, third accelerator 118C can be a synchrotron configured to supply an AC voltage with a frequency ranging from about 1 MHz to about 500 MHz (e.g., about 1 MHz, about 50 MHz, about 100 MHz, about 300 MHz, or about 500 MHz) to further increase the energy of the charged particles received from second accelerator 118B before directing them to charged particle flight guide system 120 with a fourth energy higher than the third energy. In some embodiments, the fourth energy can be about 5% to about 50% (e.g., about 5%, about 10%, about 30%, or about 50%) higher than the first energy. The synchrotron can have an accelerating tube with a diameter ranging from about 1 cm to about 1 m (e.g., about 1 cm, about 10 cm, about 50 cm, about 75 cm, or about 1 m). Though charged particle acceleration system 118 is shown in FIG. 1 to have three different types of accelerators, charged particle acceleration system 118 can have a single type or any two different types of accelerators.

Additionally or optionally, charged particle detection system 110 can have charged particle flight guide system 120 configured to increase charged particle flight path length between sample 102 and charged particle position detector 122 without increasing the length of analysis chamber 104. In some embodiments, for efficient detection, charged particle flight path length can range from about 5 cm to about 50 cm (e.g., about 5 cm, about 10 cm, about 20 cm, about 30 cm, about 40 cm, or about 50 cm). Increasing the charged particle flight path length can improve mass resolution and overcome the above discussed challenges of accurately identifying charged particles with close flight times. In some embodiments, the mass resolution can be improved by about 15% to about 30% (e.g., about 15%, about 20%, about 25%, or about 30%) compared to semiconductor metrology tools without the charged particle flight guide system.

Charged particle flight guide system 120 can include guide elements 120A-120C configured to create a guide field (e.g., an electric, a magnetic, or an electromagnetic field). In some embodiments, guide field can have an electric field ranging from about 1 kV to about 10 kV (e.g., about 1 kV, about 5 kV, about 7 kV, or about 10 kV) and/or a magnetic field ranging from about $10^{-5}$ tesla to about 3000 tesla (e.g., about $10^{-5}$ tesla, about $10^{-2}$ tesla, about 1 tesla, about 100 tesla, about 500 tesla, about 1000 tesla, about 2000 tesla, or about 3000 tesla). Guide elements 120A-120C can be positioned within analysis chamber 104 such that the shortest distance between charged particles in flight and each of guide elements 120A-120C can range from about 5 cm to about 10 cm (e.g., about 5 cm, about 8 cm, or about 10 cm). In some embodiments, guide elements 120A-120C can include electrodes, electromagnets, and/or magnetic lens to create the guide field.

The guide field can be configured to deflect the charged particles exiting charged particle acceleration system 118 and alter their flight direction. The altered flight direction (e.g., in the negative X-direction) can be opposite and substantially parallel to the flight direction (e.g., in the positive X-direction) of the charged particles exiting local electrode 114. In some embodiments, a distance $D_1$ along a Y-axis between the flight path of charged particles exiting local electrode 114 and the altered flight path can range from about 10 cm to about 20 cm (e.g., about 10 cm, about 15 cm, or about 20 cm). By increasing the flight path length, charged particles having small differences in velocity can be separated in space and time and the difference between their flight times can be increased for improved mass resolution. Though three guide elements 120A-120C are shown in FIG. 1, charged particle flight guide system 120 can have one or more guide elements.

Charged particle position detector 122 can be configured to detect the charged particles after being deflected by charged particle flight guide system 120. For the detection process, charged particle position detector 122 can be negatively biased with respect to sample 102 and/or biased at a voltage lower than the bias voltage of sample 102 and higher than the bias voltage of local electrode 114. In some embodiments, charged particle position detector can have a micro channel plate (not shown) for improved detection efficiency. In some embodiments, a distance $D_2$ between top surface of charged particle position detector 122 and sidewall of local electrode 114 facing charged particle position detector 122 along a Y-axis can range from about 10 cm to about 20 cm (e.g., about 10 cm, about 15 cm, or about 20 cm).

Charged particle position detector 122 can be further configured to measure the two-dimensional position coordinates (e.g., X-Y coordinates) of the received charged particles. These measured positions of the charged particles correlate to their original positions in sample 102. Charged particle position detector 122 can be further configured to measure the flight time of the received charged particles. The flight time of a charged particle can be the time interval between its time of generation by charged particle generation system 108 and its time of detection by charged particle position detector 122.

Processing system 124 can be configured to receive the measured two-dimensional position coordinates and the flight times of the charged particles from charged particle position detector 122. Based on the measured flight times, processing system 124 can determine the mass values and/or m/z ratios to identify the detected charged particles. Processing system 124 can be further configured to determine the sequence at which the charged particles are detected by charged particle position detector 122. Based on the detection sequence and the measured two-dimensional position coordinates, processing system 124 can determine the three-dimensional positions (e.g., X-Y-Z coordinates) of the detected charged particles. Thus, with the determined identification and the three-dimensional positions of the detected charged particles, processing system 124 can to create and output a three-dimensional image with elemental mapping of sample 102.

Figure 8:
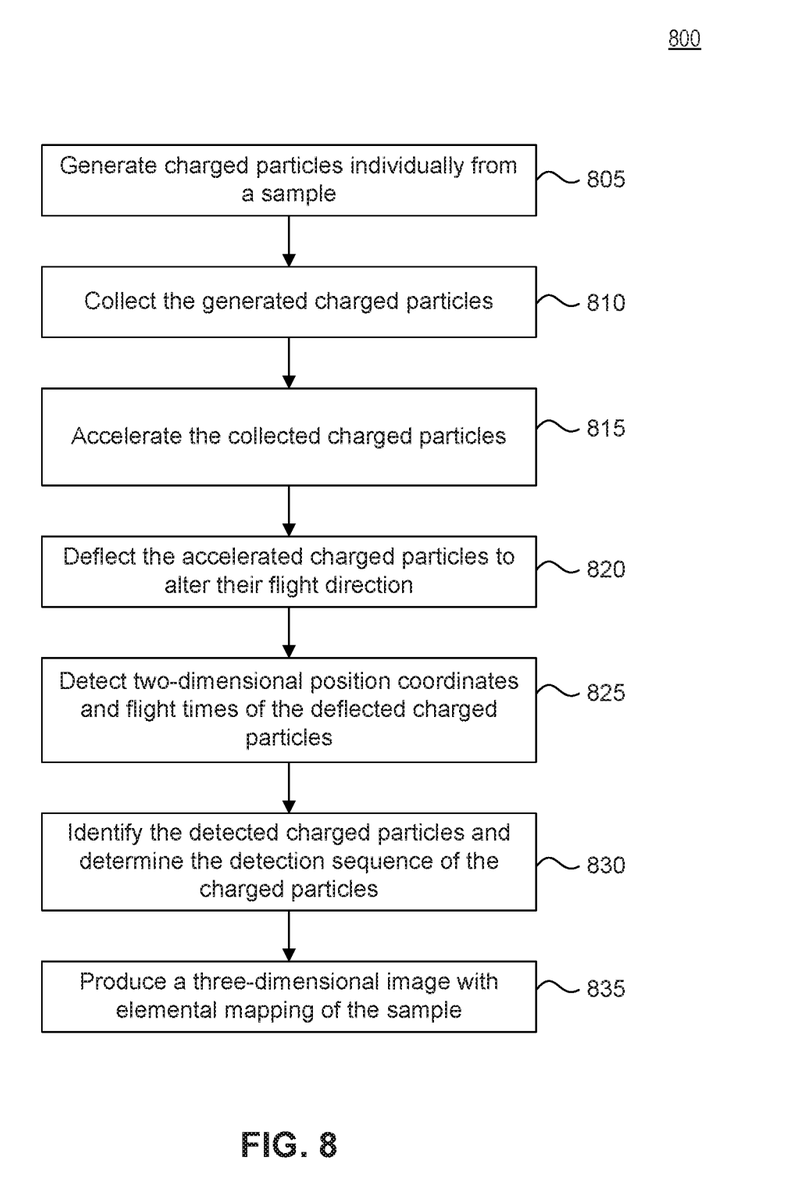
FIG. 8 is a flow chart of a method for operating a semiconductor metrology tool, in accordance with some embodiments.

FIG. 8 is a flow diagram of an example method 800 for operating a semiconductor metrology tool, according to some embodiments. The semiconductor metrology tool can be operated for characterization of planar and 3-D semiconductor devices. For illustrative purposes, method 800 is described with reference to the embodiments of FIG. 1. However, method 800 is not limited to these embodiments. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 8. In some embodiments, one or more other operations may be performed in addition to or in place of the presently described operations.

In operation 805 of FIG. 8, charged particles are generated individually from a sample. For example, as shown and discussed with reference to FIG. 1, generation of charged particles can include preparing sample 102, mounting sample 102 on sample mount 106, and applying pulsed energy to sample 102. The preparation of sample 102 can include (i) forming a wedge-shaped structure with the device region of interest (e.g., a fin region or a source/drain region of a finFET) by focused ion-beam (FIB) milling, (ii) lifting out the wedge-shaped structure using a micromanipulator attached to the wedge-shaped structure using a FIB deposition, (iii) mounting the wedge-shaped structure on a Si microtip, and (iv) electropolishing or ion milling the wedge-shaped structure to form a needle-shaped tip with a tip radius ranging from about 100 nm to about 150 nm. The application of pulsed energy to sample 102 can include applying the high voltage pulses and/or laser pulses to sample 102 by charged particle generation system 108 to generate charged particles individually from sample 102.

In operation 810 of FIG. 8, the generated charged particles are collected. For example, as shown and discussed with reference to FIG. 1, the generated charged particles can be collected by charged particle collection system 112. The collection of the generated charged particles can include creating an attractive electric field by local electrode 114 and directing the generated charged particles towards the aperture of local electrode 114. The collection of the generated charged particles can further include creating a repulsive electric field cage by charged particle capture device 116 and repelling the generated charged particles towards the aperture of local electrode 114.

In operation 815 of FIG. 8, the collected charged particles are accelerated. For example, as shown and discussed with reference to FIG. 1, the collected charged particles can be accelerated by charged particle acceleration system 118. The acceleration of the collected charged particles can include accelerating the charged particles from the first velocity to the second velocity by first accelerator 118A, followed by accelerating the charged particles from the second velocity to the third velocity by second accelerator 118B, and then accelerating the charged particles from the third velocity to the fourth velocity by third accelerator 118C. The fourth velocity can be higher than the third velocity, which can be higher than the second velocity, and the second velocity can be higher than the first velocity.

In operation 820 of FIG. 8, the accelerated charged particles are deflected. For example, as shown and discussed with reference to FIG. 1, the accelerated charged particles can be deflected by charged particle flight guide system 120 to alter the flight direction of the accelerated charged particles and increase their flight path length. The deflection of the charged particles can include positioning guide elements 120A-120C within analysis chamber 104 such that the shortest distance between charged particles in flight and each of guide elements 120A-120C can range from about 5 cm to about 10 cm and creating the guide field with guide elements 120A-120C to alter the flight direction of the charged particles.

In operation 825 of FIG. 8, two-dimensional position coordinates and flight times of the deflected charged particles are detected. For example, as shown and discussed with reference to FIG. 1, the two-dimensional position coordinates and flight times of the deflected charged particle can be detected by charged particle position detector 122. In some embodiments, operations 815 and/or 820 can be optional and operation 810 can be followed by operation 825. In such embodiments, the detection process can include detecting the collected charged particles instead of the deflected charged particles.

In operation 830 of FIG. 8, the detected charged particles are identified and the detection sequence of the charged particles are determined. For example, as shown and discussed with reference to FIG. 1, the identification of the detected particles can include determining the mass values and/or m/z ratios based on the detected flight times by processing system 124. The determination of the detection sequence of the charged particles can include monitoring the arrival of charged particles at charged particle position detector 122 by processing system 124.

In operation 835 of FIG. 8, a three-dimensional image with elemental mapping of the sample is generated. For example, as shown and discussed with reference to FIG. 1, the generation of the three-dimensional image with elemental mapping can include determining, based on the detection sequence and the two-dimensional position coordinates, the three-dimensional positions (e.g., X-Y-Z coordinates) of the detected charged particles by processing system 124.

The present disclosure provides example charged particle detection system 110 for semiconductor metrology tool 100 to improve its detection efficiency and mass resolution for analysis of sample 102. In some embodiments, charged particle detection system 110 can include charged particle capture device 116 configured to provide an electric field cage around a region between sample 102 and local electrode 114 of charged particle detection system 110. The electrical field cage can be configured to prevent the charged particles, generated from the sample, from drifting away from their flight path towards the aperture of local electrode 114. As a result, the charged particle capture device 116 can be configured to prevent and/or reduce the loss of charged particles during their flight towards local electrode 114. In some embodiments, the loss of charged particles travelling towards local electrode 114 can also be prevented and/or reduced by widening the aperture of local electrode 114. Such prevention and/or reduction of charged particle loss can improve the detection efficiency of the semiconductor metrology tool by about 60% to about 90% (e.g., about 60%, about 65%, about 70%, about 75%, about 80%, about 85%, or about 90%) compared to semiconductor metrology tools without charged particle capture device 116 and the widened aperture of local electrode 114.

In some embodiments, charged particle detection system 110 can further include charged particle acceleration system 118 configured to boost the kinetic energy of the charged particles exiting local electrode 114 and travelling towards charged particle position detector 122. The boost in the kinetic energy can prevent and/or reduce the loss of charged particles if the charged particles do not have sufficient energy to reach charged particle position detector 122. Such prevention and/or reduction of charged particle loss can improve the detection efficiency of the semiconductor metrology tool by about 50% to about 60% (e.g., about 50%, about 55%, or about 60%) compared to semiconductor metrology tools without charged particle acceleration system 118.

In some embodiments, charged particle detection system 110 can further include charged particle flight guide system 120 with guide elements 120A-120C (e.g., electrodes, electromagnets, and/or magnetic lens) configured to create guide field (e.g., an electric, a magnetic, or an electromagnetic field) to alter the flight direction of the charged particles exiting charged particle acceleration system 118. The altered flight direction can be opposite and substantially parallel to the flight direction of the charged particles exiting local electrode 114. By altering the flight direction, charged particle flight guide system 120 can increase the flight path length of the charged particles. With the increased flight path length, the difference between the flight times and calculated mass values of the charged particles can be increased, thus improving mass resolution to overcome the challenges of accurately identifying charged particles with close flight times. In some embodiments, the mass resolution can be improved by about 15% to about 30% (e.g., about 15%, about 20%, about 25%, or about 30%) compared to semiconductor metrology tools without charged particle flight guide system 120.

In some embodiments, a metrology tool includes a particle generation system, a local electrode, a particle capture device, a position detector, and a processor. The particle generation system is configured to remove a particle from a sample. The local electrode is configured to produce an attractive electric field and to direct the removed particle towards an aperture of the local electrode. The particle capture device is configured to produce a repulsive electric field around a region between the sample and the local electrode and to repel the removed particle towards the aperture. The position detector is configured to determine two-dimensional position coordinates of the removed particle and a flight time of the removed particle. The processor is configured to identify the removed particle based on the flight time.

In some embodiments, a charged particle detection system includes a local electrode configured to produce an attractive electric field and to direct a charged particle from a sample towards an aperture of the local electrode, an acceleration system, a guide system, and a position detector. The local electrode is configured to produce an attractive electric field and to direct a charged particle from a sample towards an aperture of the local electrode. The acceleration system includes first and second type accelerators different from each other. The first type accelerator is configured to accelerate a first velocity of the charged particle exiting the local electrode to a second velocity higher than the first velocity and the second type accelerator is configured to accelerate the second velocity of the charged particle exiting the first accelerator to a third velocity higher than the second velocity. The guide system is configured to create a guide field and to alter a flight path direction of the charged particle exiting the second accelerator. The position detector configured to detect two-dimensional position coordinates of the removed particle and a flight time of the charged particle.

In some embodiments, a method for detecting ionized atoms in a semiconductor metrology tool includes generating ionized atoms from a sample, producing an attractive electric field to direct the ionized atoms towards an aperture of a local electrode, producing a repulsive electric field to direct the ionized atoms towards the aperture and to prevent the ionized atom from drifting, and detecting a two-dimensional position coordinates of the ionized atoms and flight times of the ionized atoms.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metrology tool, comprising:
   a particle generation system configured to remove a particle from a sample;
   a local electrode configured to produce an attractive electric field and to direct the removed particle towards an aperture of the local electrode;
   a particle capture device positioned between the sample and the local electrode, wherein a sidewall of the particle capture device extends below a top portion of the sample and extends above a bottom portion of the local electrode, and wherein the particle capture device is configured to produce a repulsive electric field around a region between the sample and the local electrode and to repel the removed particle towards the aperture;
   a position detector configured to determine two-dimensional position coordinates of the removed particle and a flight time of the removed particle; and
   a processor configured to identify the removed particle based on the flight time.

2. The metrology tool of claim 1, wherein the particle capture device is positioned between the sample and the local electrode to enclose the region between the sample and the local electrode.

3. The metrology tool of claim 2, wherein the particle capture device is not in physical contact with the top portion and the bottom portion.

4. The metrology tool of claim 1, wherein the sidewall of the particle capture device includes a solid material, a mesh-like material, or a combination thereof.

5. The metrology tool of claim 1, wherein the particle capture device includes a conductive material.

6. The metrology tool of claim 1, wherein the sidewall of the particle capture device includes a plurality of sidewall segments arranged in a circular or a rectangular manner around a top portion of the sample.

7. The metrology tool of claim 1, wherein the particle capture device is positioned between the sample and the local electrode to form an enclosed region; and
   wherein the particle capture device includes adjustable sidewall segments to adjust a volume of the enclosed region based on a dimension of the sample or the local electrode.

8. The metrology tool of claim 1, wherein the sidewall of the particle capture device includes a sloped sidewall.

9. The metrology tool of claim 1, wherein a diameter of the aperture is about 10 to about 200 times greater than a radius or width of a base of the sample.

10. A method for detecting ionized atoms in a semiconductor metrology tool, comprising:
    generating ionized atoms from a sample;
    producing an attractive electric field to direct the ionized atoms towards an aperture of a local electrode;
    producing a repulsive electric field with a particle capture device positioned between the sample and the local electrode to direct the ionized atoms towards the aperture and to prevent the ionized atom from drifting, wherein a sidewall of the particle capture device extends below a top portion of the sample and extends above a bottom portion of the local electrode; and
    detecting two-dimensional position coordinates of the ionized atoms and flight times of the ionized atoms.

11. The method of claim 10, wherein the producing the repulsive electric field comprises applying a positive bias to the particle capture device enclosing a region between the sample and the local electrode with a conductive material.

12. The method of claim 10, wherein the producing the repulsive electric field comprises applying a positive bias ranging from about 1 V to about 1 kV to a particle capture device disposed between the sample and the local electrode.

13. The method of claim 10, wherein the producing the attractive electric field comprises applying a first voltage to the sample and applying a second voltage to the local electrode, and wherein an absolute value of the first voltage is greater than an absolute value of the second voltage.

14. The method of claim 10, further comprising moving the local electrode along a horizontal direction to maintain a horizontal distance ranging from about 0.5 mm to about 5 mm between the local electrode and the sample during the generating the ionized atoms.

15. A metrology tool, comprising:
a particle generation system configured to generate a charged particle from a sample;
a local electrode configured to attract the charged particle towards an aperture of the local electrode, wherein the aperture is wider than a width of the sample;
a capture device, disposed between the sample and the local electrode, configured to direct the charged particle towards the aperture with a repulsive electric field, wherein a sidewall of the capture device extends below a top portion of the sample and extends above a bottom portion of the local electrode; and
a detector configured to determine position coordinates and a flight time of the charged particle.

16. The metrology tool of claim 15, further comprising a processing system configured to determine an identification of the charged particle based on the flight time.

17. The metrology tool of claim 15, wherein the sidewall of the capture device includes a solid conductive material, a mesh-like conductive material, or a combination thereof.

18. The metrology tool of claim 15, wherein the capture device encloses a portion of the electrode and a portion of the sample.

19. The metrology tool of claim 15, wherein the sidewall of the capture device includes a plurality of sidewall segments arranged in a circular or a rectangular configuration.

20. The metrology tool of claim 15, wherein the capture device includes a funnel-shaped structure.

* * * * *